| United States Patent [19] | [11] | 4,098,617 |
|---|---|---|
| Lidorenko et al. | [45] | Jul. 4, 1978 |

[54] METHOD OF MANUFACTURING FILM THERMOPILE

[76] Inventors: Nikolai Stepanovich Lidorenko, 3 Mytischinskaya ulitsa, 14-a, kv. 127; Nikolai Vasilievich Kolomoets, ulitsa Kastanaevskaya, 61, kv. 22; Zinovy Moiseevich Dashevsky, ulitsa Marxa-Engelsa, 15, kv. 52; Vladimir Isaakovich Granovsky, ulitsa Bazhova, 15, kor. 1, kv. 84; Elena Alexandrovna Zhemchuzhina, ulitsa Raspletina, 4, kor. 3, kv. 85; Lev Nikolaevich Chernousov, ulitsa Tsentralnaya, 13, kv. 47; Igor Aronovich Shmidt, Leningradsky prospekt, 24, kv. 41; Ljudmila Alexeevna Nikolashina, ulitsa Kukhmisterova, 3, kor. 2, kv. 103; David Mendeleevich Gelfgat, ulitsa Nagornaya, 49, kor. 18, kv. 58; Igor Vladimirovich Sgibnev, Frunzensky val, 38, kv. 6, all of Moscow, U.S.S.R.

[21] Appl. No.: 615,845

[22] Filed: Sep. 23, 1975

[51] Int. Cl.² ............... H01L 21/00; H01L 35/16

[52] U.S. Cl. .................... 148/1.5; 136/201; 136/225; 136/238; 136/240; 252/62.3 T; 427/53; 427/54; 427/55; 427/56; 427/74; 427/75; 427/76; 427/82; 427/87; 427/261; 427/372 R; 427/380

[58] Field of Search ............ 427/87, 82, 372 R, 53, 427/54, 55, 56, 74, 75, 76, 82, 87, 91, 248 R, 255, 380, 372 R, 256, 264, 271, 272, 282, 286, 294, 259; 357/61, 87; 136/201, 225, 238, 240; 148/1.5; 252/62.3 T

[56] References Cited

U.S. PATENT DOCUMENTS

| 3,020,326 | 2/1962 | Fredrick | 357/87 |
| 3,441,449 | 4/1969 | Green | 357/87 |

*Primary Examiner*—Michael F. Esposito
*Attorney, Agent, or Firm*—Holman & Stern

[57] ABSTRACT

A method of manufacturing a film thermopile, whereby a film of a thermoelectric semiconductor material which is an n-type stoichiometric solid solution containing $Bi_2Te_3$ and $Sb_2Te_3$ is deposited on a substrate. Then heating is effected so that adjacent arms of the film are at different temperatures, some at a temperature of not above 300° C, and others at a temperature of not less than 350° C.

3 Claims, 4 Drawing Figures

METHOD OF MANUFACTURING FILM THERMOPILE

BACKGROUND OF THE INVENTION

The present invention relates to manufacturing converters of heat to electric energy and, more specifically, to a method of manufacturing a film thermopile.

Known at present is a method of manufacturing a film thermopile, whereby strips of a thermoelectric semiconductor material of one type of conduction, e.g. a p-type (p-arms) are deposited through an aligned mask on a substrate of an insulation material. After depositing the p-type material, in order to improve its electrical and physical properties, it is common to effect heating in an inert medium or in a vacuum. Then the aligned mask is changed and strips of a thermoelectric semiconductor material of an n-type (n-arms) are deposited and refined in an inert medium or in a vacuum. Usually the chemical composition of the p-arm material differs from that of the n-arm material, therefore the refinement conditions for the p-arm material differs from those of the n-arm material, which necessitates two separate steps of heating for the p-arms and the n-arms.

Having deposited the p- and n-arms, switching buses are deposited for electrical connection of the p- and n-arms.

This method of manufacturing a film thermopile brings about the necessity of aligning masks to deposit the p- and n-arms which greatly limits the minimum width of the arms.

Also, the deposited arms of one type should be protected against damage by aligned masks while depositing the arms of opposite conduction. The arms of one type being deposited, an operation of changing the masks for depositing the arms of another type is necessary, too. This operation considerably lengthens the technological process of manufacturing a film thermopile. Moreover, the changing of the masks may cause damage to the active layer of the p- or n-arms.

The known method makes it impossible to clean the substrate surface by heat treatment as the substrate heating may result in re-evaporation of the p-arms already deposited. It is possible to overcome this drawback by depositing arms of both types simultaneously, e.g. evaporating the p-arms from one crucible and the n-arms from another crucible, however films of uniform thickness and composition would not be obtained.

SUMMARY OF THE INVENTION

It is an object of the present invention to provide a method of manufacturing a film thermopile including depositing p- and n-type arms in one operation.

It is another object of the present invention to provide such a method of manufacturing a film thermopile which ensures uniformity of thickness and composition of deposited semiconductor material films.

The foregoing objects are attained by providing a method of manufacturing a film thermopile by depositing a thermoelectric semiconductor material film on a substrate with further heating in an inert medium, using an n-type stoichiometric solid solution containing $Bi_2Te_3$ and $Sb_2Te_3$ as the semiconductor material. Heating is carried out in such a way that adjacent arms are at different temperatures, some being at a temperature of not above 300° C, whereas the others are at a temperature of not less than 350° C. It is advisable to use a solid solution containing 50 mol. percent of $Bi_2Te_3$ and 50 mol. percent of $Sb_2Te_3$.

The disclosed method of manufacturing a film thermopile considerably accelerates the technological process, as the active arms are deposited in one operation, which eliminates the necessity of changing masks, after having deposited the arms of one type, for depositing the arms of another type, and due to the fact that this method provides simultaneous heating of the p- and n-arms. Moreover, the method makes it possible to produce film thermopiles without utilization of aligned masks, which greatly reduces the minimum width of the arms.

BRIEF DESCRIPTION OF THE DRAWING

The invention will now be described in greater detail with reference to a specific embodiment thereof, taken in conjunction with the accompanying drawings, wherein.

DETAILED DESCRIPTION OF THE PREFERRED EMBODIMENTS

Figure 1:
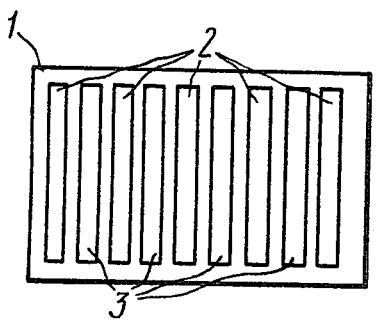
FIG. 1 is a schematic top view of the intermediate stage of manufacturing a film thermoelectric battery, being produced according to the first embodiment of the method, according to the invention.
Figure 2:
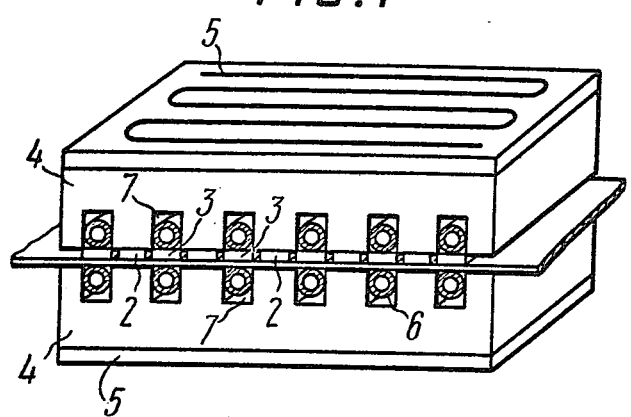
FIG. 2 is an arrangement for heating of the p- and n-arms of a film thermoelectric battery shown in FIG. 1.

The first embodiment of the method of manufacturing a film thermoelectric battery is as follows. A stoichiometric solid solution containing 50 mol. percent of $Bi_2Te_3$ and 50 mol. percent of $Sb_2Te_3$ is deposited on a substrate 1 (FIG. 1) made of a dielectric material, on all the active parts of a film thermopile with the aid of an aligned mask (not shown in FIG. 1), the temperature of the substrate being within the limits of 200° to 275° C, and films 2 and 3 of an n-type semiconductor material are formed, the density of current carriers being in the order of $1.10^{19}$–$3.10^{19}$ $1_3$/cm. Then heating of the deposited films 2 and 3 is effected in an inert medium (e.g. in argon). In doing so, the films 2 are refined at a temperature of 350° C, and the films 3 are refined at a temperature of 300° C, using an arrangement shown in FIG. 2 for this purpose. This arrangement consists of two heaters 4 and each of the heaters is provided with a heating element 5 and tubes 6 housed in slots 7 of the heaters 4. A cooling liquid (e.g. glycerine) runs through the tubes 6. The substrate 1 with the deposited films 2 and 3 is placed between the heaters 4 in such a way that the films 2 contact the heater 4 and the films 3 contact the tubes 6. In doing so, the temperature of the films 2 is kept at 350° C with the aid of the heating elements 5, and the temperature of the films 3 is kept at 300° C by regulating the cooling liquid flowing through the tubes 6. The heating being completed, the films 3 have an n-type conduction (n-arms) and the following thermoelectric parameters: a thermal electromotive force coefficient $\alpha = -260$ to $-240$ microvolts/degree and a conductivity about 700 to 1000 1/ohm cm. The films 2 have a p-type conduction to make p-arms with a hole concentration of $1.10^{19}$–$5.10^{19}$ $cm^{-3}$. The current carrier mobility in the p-type films 2 is approximately the same as that in the n-type films 3, of the order of 400 cm$^2$ per second. Within the range of indoor temperatures, the thermoelectric efficiency of both arms is in the order of $3 \cdot 10^{-3} - 3.3 \cdot 10^{-3}$ 1/degree.

The heating being completed, switching buses are deposited (not shown) for electric connection of the film thermoelectric battery p- and n-arms. The switching buses are made of a metal and are deposited in any known method, e.g. by evaporation.

Figure 3:
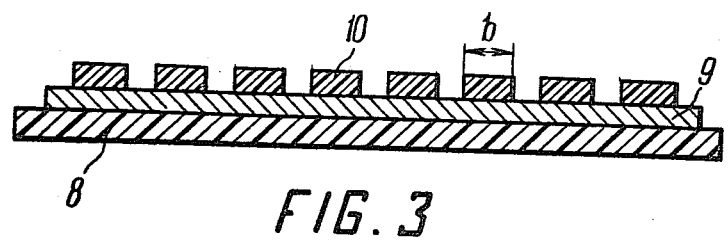
FIG. 3 is a sectional view of the intermediate stage of manufacturing a film thermoelectric battery, being produced according to the second embodiment of the method, according to the invention.
Figure 4:
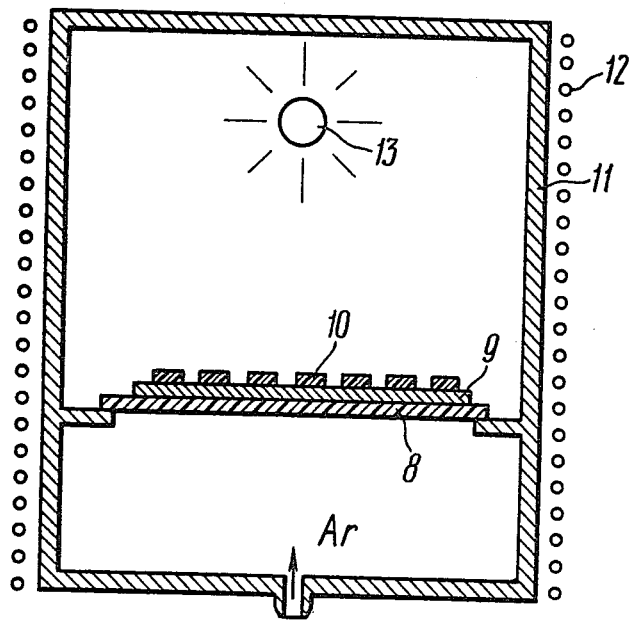
FIG. 4 is an arrangement for heating of the p- and n-arms of a film thermopile of FIG. 3.

Another embodiment of the disclosed method of manufacturing a film thermoelectric battery can also be realized. This embodiment differs from the one discussed above in that a stoichiometric solid solution containing 60 mol. percent of $Bi_2Te_3$ and 40 mol. percent of $Sb_2Te_3$ is deposited (e.g. by evaporation) on all the surface of a substrate 8 (FIG. 3) made of a flexible dielectric material without using an aligned mask, the substrate temperature being 200° to 300° C, and form a semi-conductor n-type film 9. Then strips 10 of antimony oxide (antimony black) are deposited on the surface of the semiconductor n-type film 9. In doing so, the strips 10 can be evaporated with the aid of an aligned mask if their width "b" is not less than 0.1 mm. To make the strips 10 narrower it is advisable to use a photolithography method, or the layer of the antimony black could be cut with a laser to obtain the necessary shape of the antimony black layer. That being the case, the semiconductor film 9 is covered with a continuous layer of the antimony black. The continuous layer is cut through with the laser or etched through by a photolithography method to the semiconductor film 9, thus producing the antimony oxide strips 10. Then the substrate 8 with the evaporated film 9 on which the antimony oxide strips 10 are deposited, is placed in an arrangement for heating shown in FIG. 4. This arrangement consists of a chamber 11, filled with argon, a heating element 12 wound on the external side of the chamber 11 and a source of light 13 placed inside the chamber 11. A temperature on the order of 280° C is kept inside the chamber 11 with the aid of the heating element 12, and the film 9 is illuminated with a luminous flux of the order of 0.1 - 0.2 w/cm$^2$.

The sections of the film 9 covered with the strips 10, almost completely absorb the luminous flux from the light source 13 and are heated to a temperature of 350° to 380° C, so after refinement these sections of the film 9 acquire a p-type conduction (p-type arms).

The sections of the film 9, not covered with the antimony black, absorb the luminous flux to a considerably lesser degree and are heated only to 300° C, so after refinement these sections of the film have an n-type conduction (n-arms). After heating switching buses (not shown) are deposited in the contact places of the p- and n-arms, and the substrate 8 is accordion-pleated along these buses. Thermal buses (not shown) are connected to the bending places of the substrate 8.

The embodiment of the disclosed method described above recommends the most advisable content of $Bi_2Te_3$ and $Sb_2Te_3$ in solid solution. But the relation of the components of the solid solution may be different, provided that the film of this solution deposited on the substrate has an n-type conductivity. In particular, the solid solution may contain approximately 50 or more mol. percent of $Bi_2Te_3$, and approximately 50 or less mol. percent of $Sb_2Te_3$.

What is claimed is:

1. A method of manufacturing a film thermopile having N-type and P-type arms, comprising the steps of:
   depositing a film of a thermoelectric semiconductor material which is an N-type solid solution containing $Bi_2Te_3$ and $Sb_2Te_3$ on a substrate; and
   processing said substrate in an inert medium by heating portions of the film, corresponding to the desired N-type arms, to a temperature of not above 300° C, thereby forming said n-type arms and simultaneously heating other areas of the film, which correspond to the desired P-type arms, to a temperature of not less than 350° C. thereby forming said p-type arms.

2. The method of claim 1, wherein said solid solution contains 50 mol. percent of $Bi_2Te_3$ and 50 mol. percent of $Sb_2Te_3$.

3. The method of claim 1, wherein said processing step includes the steps of:
   depositing strips of antimony oxide over a portion of said film of thermoelectric semiconductor material;
   heating said thermoelectric semiconductor material such that material not having antimony oxide deposited thereover is heated to a temperature of not above 300° C, forming N-type arms; and
   exposing said material to an illumination source such that said portion of said semiconductor material having antimony oxide deposited thereupon is heated to a temperature of not less than 350° C forming P-type arms.

* * * * *